(12) United States Patent
Amar et al.

(10) Patent No.: US 12,562,668 B2
(45) Date of Patent: Feb. 24, 2026

(54) METHODS AND SYSTEMS FOR MONITORING A VOLTAGE SUPPLY

(71) Applicant: DANA TM4 INC., Boucherville (CA)

(72) Inventors: Mohammed Amar, Montreal (CA); Maalainine El Yacoubi, Sainte Julie (CA); Pascal Fleury, Sainte-Madeleine (CA); Omar Saade, Montreal (CA); Ibrahima Kaba, Montreal (CA); Alexis Maslyczyk, Montreal (CA)

(73) Assignee: DANA TM4 INC., Boucherville (CA)

( * ) Notice: Subject to any disclaimer, the term of this patent is extended or adjusted under 35 U.S.C. 154(b) by 234 days.

(21) Appl. No.: 18/460,417

(22) Filed: Sep. 1, 2023

(65) Prior Publication Data

US 2025/0080029 A1    Mar. 6, 2025

(51) Int. Cl.
| | |
|---|---|
| *H02P 1/04* | (2006.01) |
| *B60L 3/00* | (2019.01) |
| *B60L 15/00* | (2006.01) |
| *G01P 3/48* | (2006.01) |
| *G01R 19/165* | (2006.01) |
| *H02P 27/06* | (2006.01) |
| *H02P 29/024* | (2016.01) |

(52) U.S. Cl.
CPC .......... *H02P 29/0241* (2016.02); *B60L 3/003* (2013.01); *B60L 15/007* (2013.01); *G01P 3/48* (2013.01); *G01R 19/16576* (2013.01); *H02P 27/06* (2013.01); *B60L 2240/421* (2013.01)

(58) Field of Classification Search
CPC ........ H02P 29/0241; H02P 27/06; H02P 3/22; H02P 29/024; H02P 29/028; H02P 6/182; H02P 3/12
See application file for complete search history.

(56) References Cited

U.S. PATENT DOCUMENTS

| | | | | |
|---|---|---|---|---|
| 9,906,172 | B2 | 2/2018 | Ross | |
| 11,332,029 | B2 * | 5/2022 | Wang | B60L 58/15 |
| 2007/0007929 | A1 * | 1/2007 | Lee | H02P 27/06 |
| | | | | 318/802 |
| 2014/0191700 | A1 * | 7/2014 | Eberlein | B60L 3/0061 |
| | | | | 318/504 |

FOREIGN PATENT DOCUMENTS

| | | | | |
|---|---|---|---|---|
| CN | 110667381 A | 1/2020 | | |
| CN | 113224836 A | 8/2021 | | |
| DE | 102019217834 A1 * | 5/2021 | ............. | B60L 3/003 |
| WO | 2021057437 A1 | 4/2021 | | |

* cited by examiner

*Primary Examiner* — Karen Masih
(74) *Attorney, Agent, or Firm* — McCoy Russell LLP

(57) ABSTRACT

Methods and systems are provided for a traction system of a vehicle. In one example, a method includes selecting between strategies for activating a steady state of an inverter based on an electric motor speed and a de bus voltage. The strategies include activating an active short circuit (ASC) or a hardware active short circuit (HASC) based on an activity of a controller. The strategies may further include a freewheel strategy.

20 Claims, 7 Drawing Sheets

METHODS AND SYSTEMS FOR MONITORING A VOLTAGE SUPPLY

TECHNICAL FIELD

The present description relates generally to monitoring a low-voltage supply of a controller.

BACKGROUND AND SUMMARY

Electric vehicles may utilize one or more controllers for controlling operation of different components of a vehicle. When an electrical connection is altered, performance of a component or components may be negatively changed. Some examples for monitoring the electrical connection include the addition of monitoring hardware and a back-up power supply. In such examples, when it is detected that an electrical connection is interrupted or altered, a power supply to the controller is switched, to maintain operation of the controller.

However, the inventors have found certain drawbacks to the previous solutions. For example, when the traction system is operating according to determined operating parameters, switching a transistor of an inverter may be in sync with a movement of a rotor of a motor. When a degradation is detected in a control loop of the inverter, the traction system and/or a drive system may operate outside of the determined operating parameters, which may lead to degradation or sub-optimal performance. As such, methods and systems for addressing situations due to a change in the control loop of the inverter may be desired.

In one example, the issues described above may be at least partially solved by a method for an inverter of a traction system comprising an electric motor, the method comprising selecting between strategies for activating a steady state of the inverter based on an electric motor speed and a dc bus voltage. By doing this, a longevity of components of the inverter and the traction system may be increased.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE FIGURES

The above, as well as other advantages of the present disclosure, will become readily apparent to those skilled in the art from the following detailed description when considered in light of the accompanying drawings in which.

DETAILED DESCRIPTION

Figure 1:
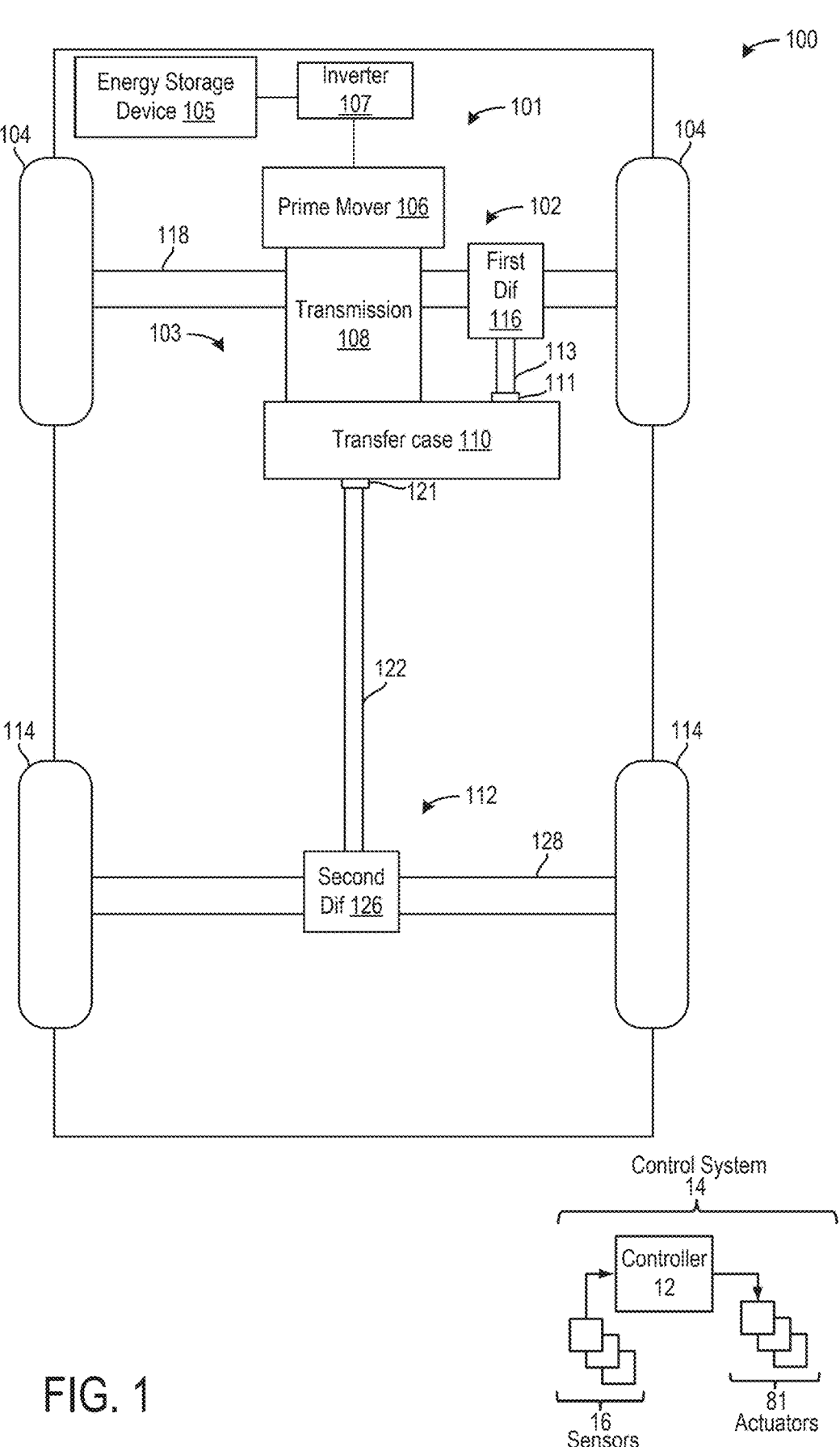
FIG. 1 is a schematic depiction of an example vehicle powertrain, according to an embodiment of the present disclosure.
Figure 2:
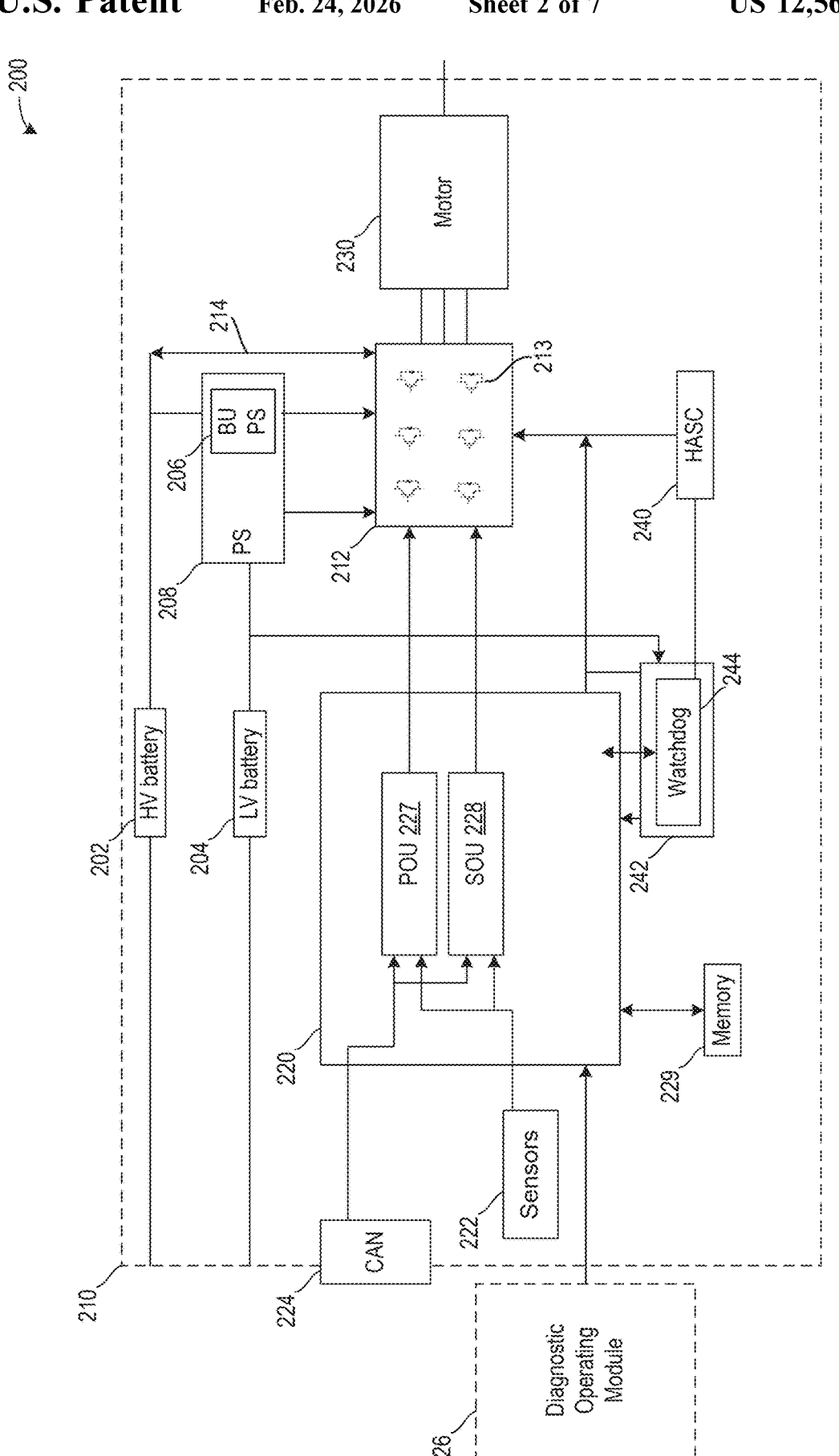
FIG. 2 shows a circuit of a controller of the vehicle powertrain, according to an embodiment of the present disclosure.
Figure 3:
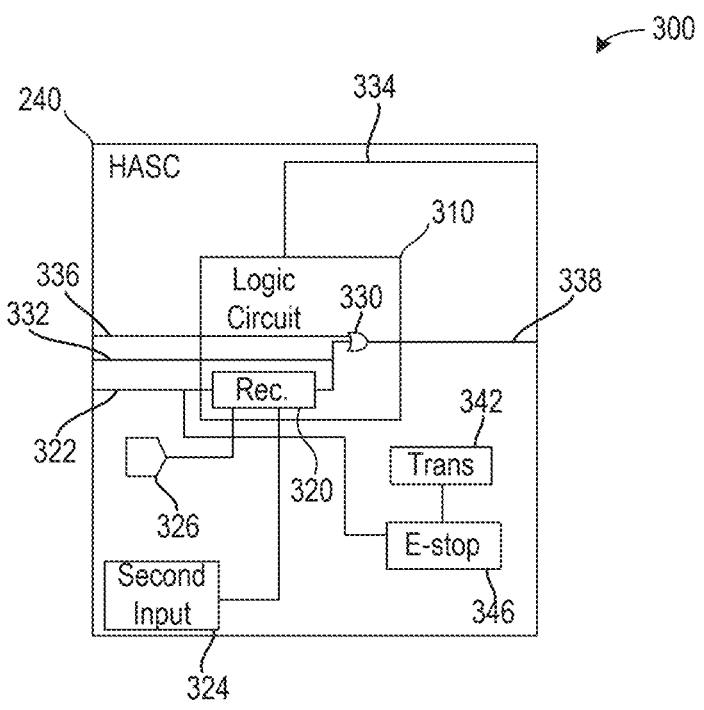
FIG. 3 shows an example of a hardware active short circuit (HASC) of the circuit of FIG. 2, according to an embodiment of the present disclosure.
Figure 4:
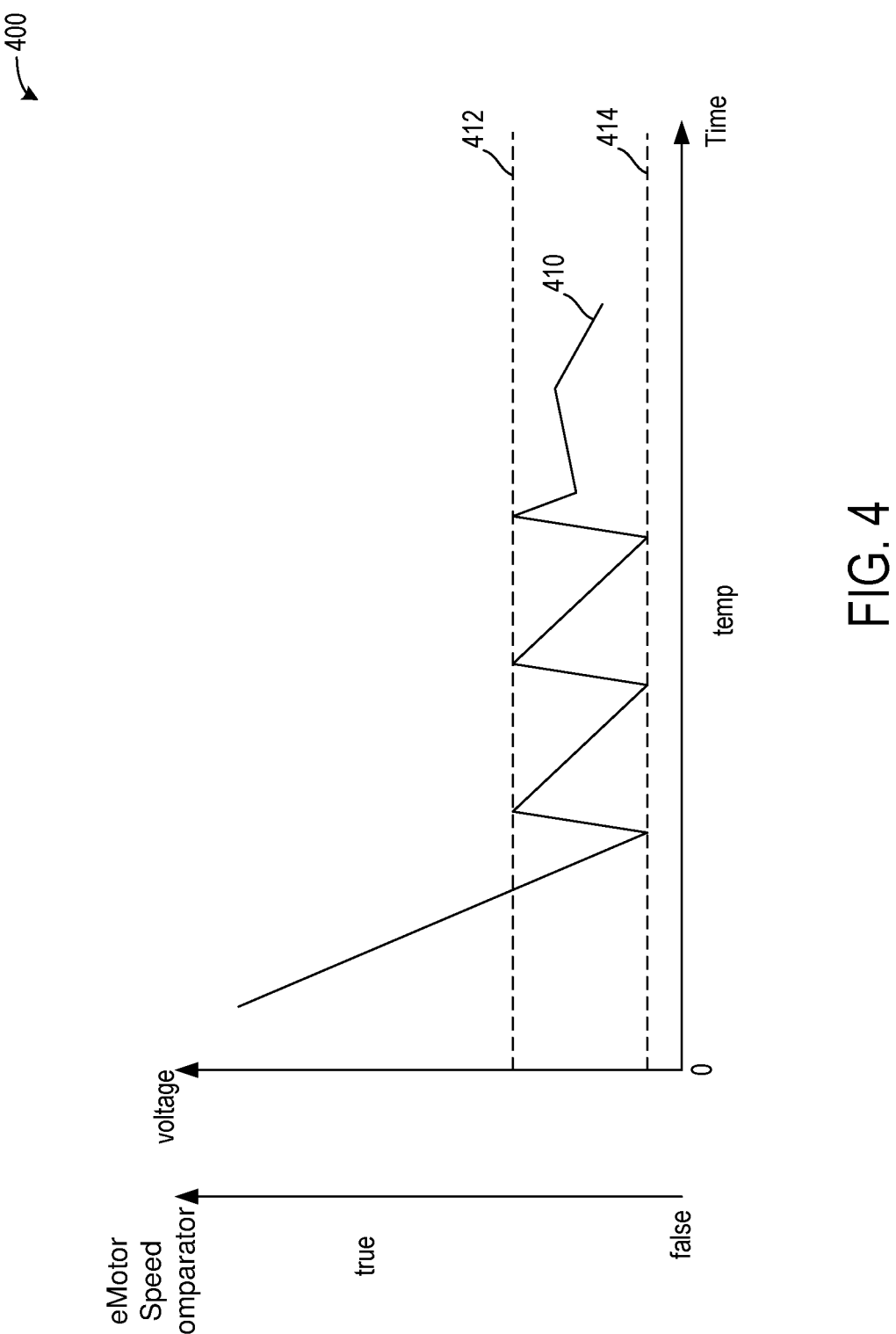
FIG. 4 shows a plot illustrating an effect of the HASC on motor temperature; according to an embodiment of the present disclosure.
Figures 5A, 5B:
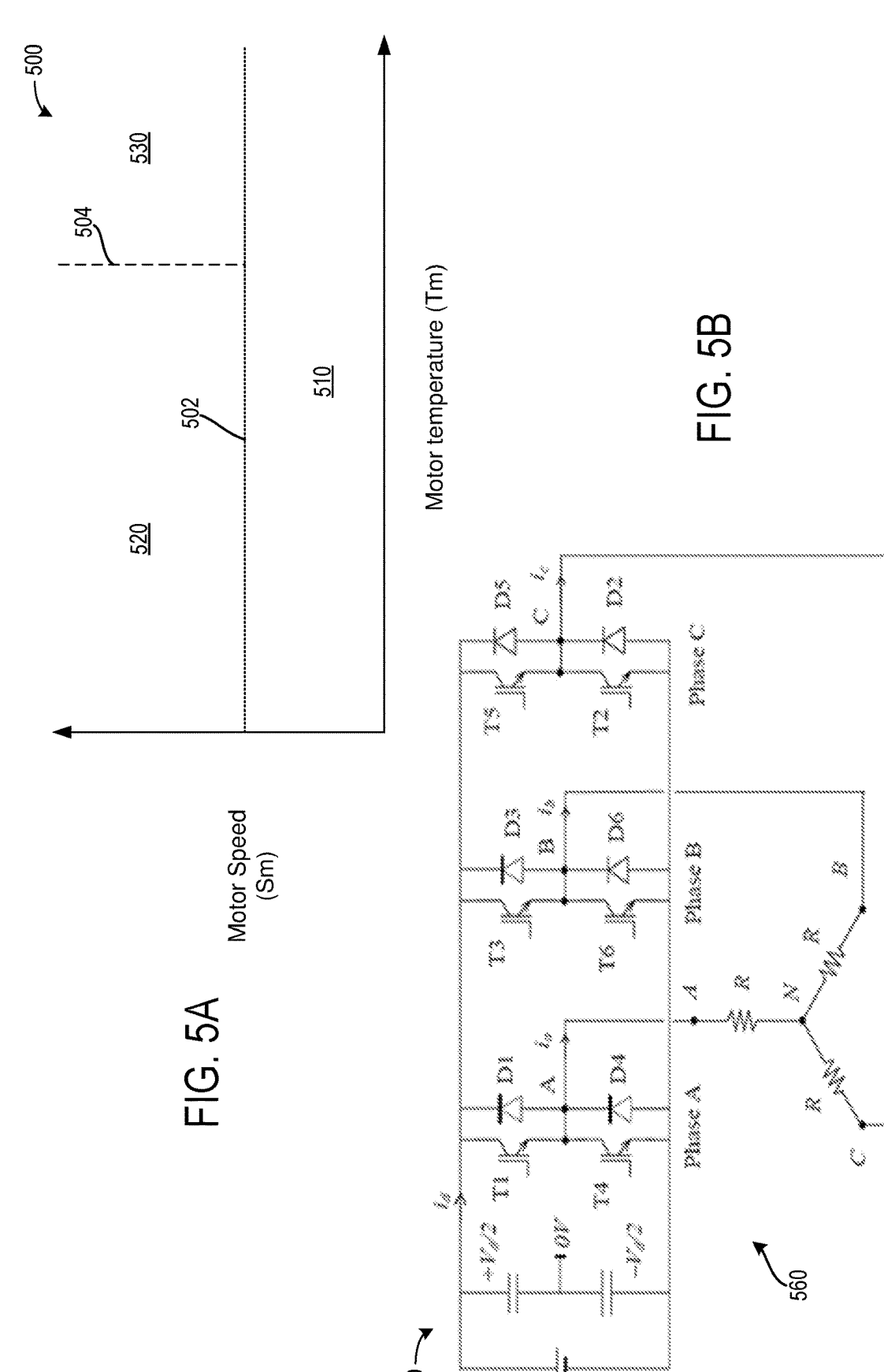
FIG. 5A shows a plot illustrating selection of a first state and/or a second state in response to conditions, according to an embodiment of the present disclosure.
FIG. 5B shows a plot illustrating a circuit board of the inverter, according to an embodiment of the present disclosure.
Figure 6:
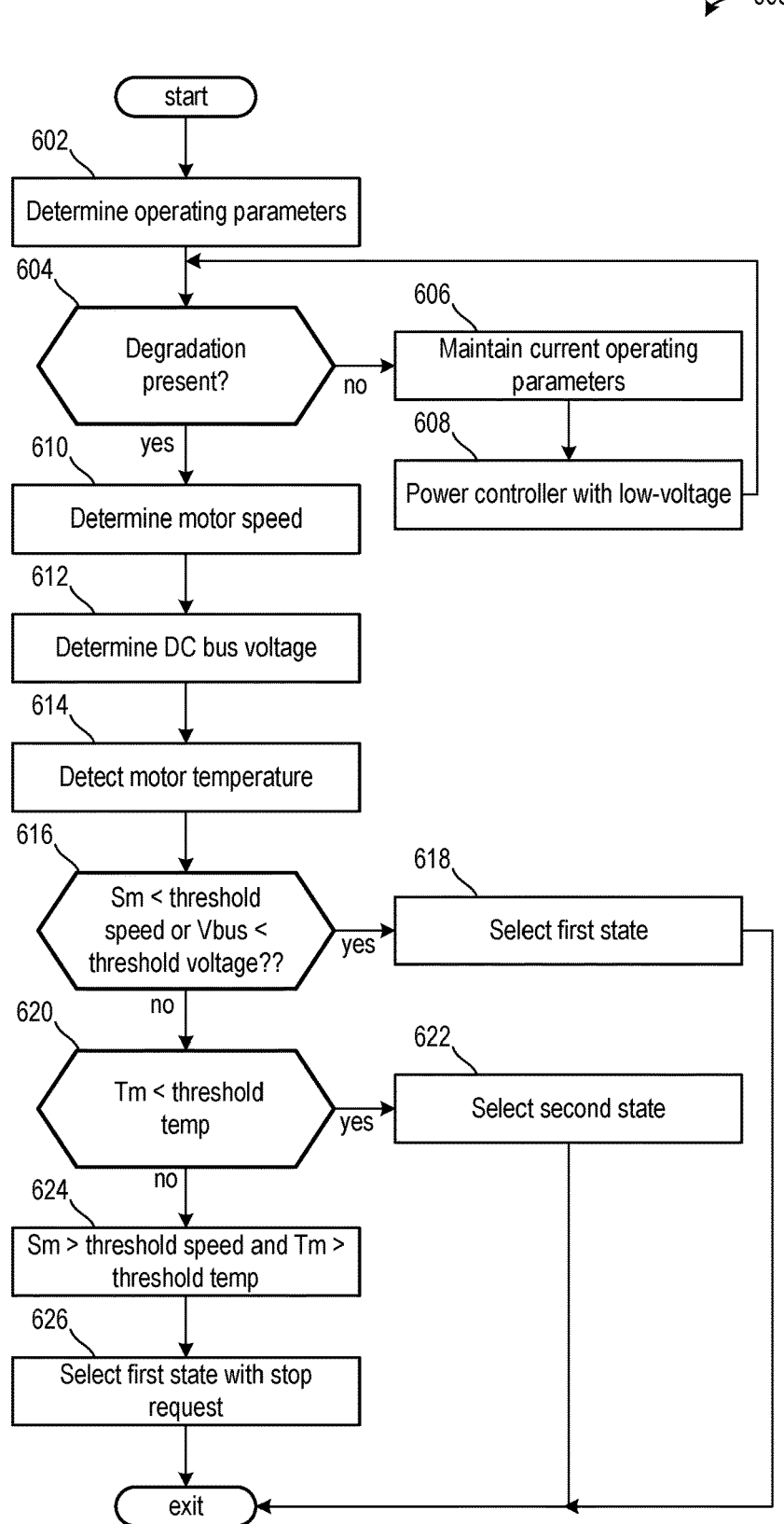
FIG. 6 shows a method for determining a degradation and selecting one or more of a first state and a second state, according to an embodiment of the present disclosure.
Figure 7:
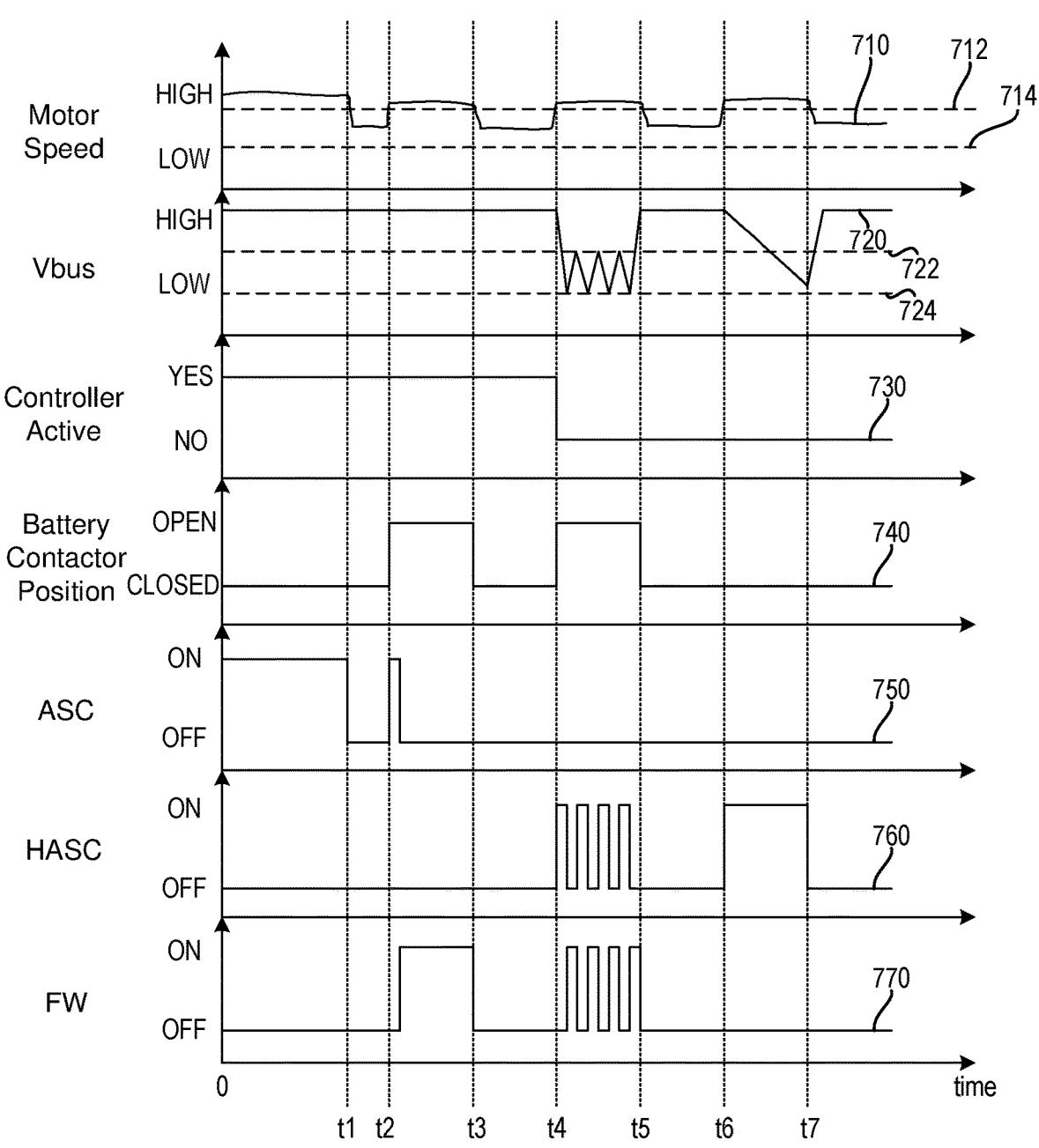
FIG. 7 shows an operating sequence of the inverter.

The following description relates to adjusting an operating state of an inverter in response to a condition. The inverter may be an inverter of a vehicle as shown in FIG. 1. Circuits of a controller and an active short circuit are shown in FIGS. 2 and 3, respectively. FIG. 4 shows a plot illustrating an effect of the HASC on motor temperature. FIG. 5A shows a plot illustrating selection of a first state and/or a second state in response to conditions. FIG. 5B shows a plot illustrating a circuit board of the inverter. FIG. 6 shows a method for determining a degradation and selecting one or more of a first state and a second state. FIG. 7 shows an operating sequence of the inverter.

The operating state of the inverter may be adjusted to one of two steady states based on a motor speed and a de bus voltage. The two steady states may be reached via one or more short circuits, one configured as software and the other configured as hardware.

Turning now to FIG. 1, a vehicle 100 is shown comprising a powertrain 101 and a drivetrain 103. The powertrain comprises a prime mover 106 and a transmission 108. The prime mover 106 may be an internal combustion engine or a traction motor (e.g., an electric motor), for example, and is operated to provide rotary power to the transmission 108. The transmission 108 may be any type of transmission, such as a manual transmission, an automatic transmission, or a continuously variable transmission. The transmission 108 receives the rotary power produced by the prime mover 106 as an input and outputs rotary power to the drivetrain 103 in accordance with a selected gear or setting.

The prime mover 106 may be powered via energy from an energy storage device 105. In one example, the energy storage device 105 is a battery configured to store electrical energy. An inverter 107 may be arranged between the energy storage device 105 and the prime mover 106 and configured to convert direct current (DC) to alternating current (AC).

The vehicle 100 may be a commercial vehicle, light, medium, or heavy duty vehicle, a passenger vehicle, an off-highway vehicle, and sport utility vehicle. Additionally or alternatively, the vehicle 100 and/or one or more of its components may be in industrial, locomotive, military, agricultural, and aerospace applications. In one example, the vehicle 100 is an electric vehicle.

In some examples, such as shown in FIG. 1, the drivetrain 103 includes a first axle assembly 102 and a second axle assembly 112. The first axle assembly 102 may be configured to drive a first set of wheels 104, and the second axle assembly 112 may be configured to drive a second set of wheels 114. In one example, the first axle assembly 102 is arranged near a front of the vehicle 100 and thereby comprises a front axle, and the second axle assembly 112 is arranged near a rear of the vehicle 100 and thereby comprises a rear axle. The drivetrain 103 is shown in a four-wheel drive configuration, although other configurations are possible. For example, the drivetrain 103 may include a front-wheel drive, a rear-wheel drive, or an all-wheel drive configuration. Further, the drivetrain 103 may include one or more tandem axle assemblies. As such, the drivetrain 103 may have other configurations without departing from the scope of this disclosure, and the configuration shown in FIG. 1 is provided for illustration, not limitation. Further, the vehicle 100 may include additional wheels that are not coupled to the drivetrain 103.

In some four-wheel drive configurations, such as shown in FIG. 1, the drivetrain 103 includes a transfer case 110 configured to receive rotary power output by the transmission 108. A first driveshaft 113 is drivingly coupled to a first output 111 of the transfer case 110, while a second driveshaft 122 is drivingly coupled to a second output 121 of the transfer case 110. The first driveshaft 113 (e.g., a front driveshaft) transmits rotary power from the transfer case 110 to a first differential 116 of the first axle assembly 102 to drive the first set of wheels 104, while the second driveshaft 122 (e.g., a rear driveshaft) transmits the rotary power from the transfer case 110 to a second differential 126 of the second axle assembly 112 to drive the second set of wheels 114. For example, the first differential 116 is drivingly coupled to a first set of axle shafts 118 coupled to the first set of wheels 104, and the second differential 126 is drivingly coupled to a second set of axle shafts 128 coupled to the second set of wheels 114. It may be appreciated that each of the first set of axle shafts 118 and the second set of axle shafts 128 may be positioned in a housing.

In some examples, additionally or alternatively, the vehicle 100 may be a hybrid vehicle including both an engine an electric machine each configured to supply power to one or more of the first axle assembly 102 and the second axle assembly 112. For example, one or both of the first axle assembly 102 and the second axle assembly 112 may be driven via power originating from the engine in a first operating mode where the electric machine is not operated to provide power (e.g., an engine-only mode), via power originating from the electric machine in a second operating mode where the engine is not operated to provide power (e.g., an electric-only mode), and via power originating from both the engine and the electric machine in a third operating mode (e.g., an electric assist mode). As another example, one or both of the first axle assembly 102 and the second axle assembly 112 may be an electric axle assembly configured to be driven by an integrated electric machine.

Vehicle 100 may further include a control system 14. Control system 14 is shown receiving information from a plurality of sensors 16 (various examples of which are described herein) and sending control signals to a plurality of actuators 81 (various examples of which are described herein). As one example, sensors 16 may include a proximity sensor and/or a multimeter coupled an anti-theft device arranged adjacent to an interface between the prime mover 106 and the transmission housing 108 and/or an axle housing.

Controller 12 may be configured as a conventional microcomputer including a microprocessor unit, input/output ports, read-only memory, random access memory, keep alive memory, a controller area network (CAN) bus, etc. Controller 12 may be configured as a powertrain control module (PCM). The controller may be shifted between sleep and wake-up modes for additional energy efficiency. The controller may receive input data from the various sensors, process the input data, and trigger the actuators in response to the processed input data based on instruction or code programmed therein corresponding to one or more routines.

Turning now to FIG. 2, it shows a schematic view of a traction system 200. In one example, the traction system 200 is a non-limiting example of the drivetrain 103 of the vehicle 100. The traction system 200 includes hardware configured to sense one or more conditions of a vehicle, such as motor speed and motor temperature, for adjusting operating conditions of an inverter 210 of the traction system. The inverter 210 may include a transistor 212. The transistor 212 may be an insulated gate bipolar transistor (IGBT) or a metal-oxide semiconductor field-effect transistor (MOSFET). A detailed example of the transistor 212 is shown in FIG. 5B. The transistor 212 may include a number of gates 213 equal to a number of inputs. In one example, the gates 213 may be referred to herein as switches and/or contactors. For example, a battery contactor may refer to a contactor associated with a wire coupling from the battery to the associated gate of the gates 213 of the transistor 212.

A high-voltage (HV) battery 202 may be coupled to the transistor 212 directly via a connection 214. A low-voltage (LV) battery 204 may be coupled to the transistor 212 via a power supply 208. In one example, the power supply 208 is configured to supply power to the transistor 212 at a voltage equal to a voltage of the LV battery 204. The power supply 208 may include a back-up power supply 206. The back-up power supply 206 may be a capacitor and configured to operate when power to a controller 220 is interrupted, when the controller 220 is degraded, or when the controller 220 is inactive. In one example, the voltage of the HV battery 202 is greater than a voltage of the LV battery 204. The HV battery 202 may be 48V and the LV battery 204 may be 12V. Additionally or alternatively, the HV battery 202 may be 24V and the LV battery 204 may be 12V. In other examples, the HV battery 202 may be 12V and the LV battery 204 may be 5V.

The controller 220 may be coupled to the transistor 212. In one example, the controller 220 is a non-limiting example of the controller 12 of FIG. 1. Additionally or alternatively, the controller 220 may be a controller of only the inverter 210 and different than the controller 12 of FIG. 1. The controller 220 may receive inputs from a sensor system 222 and a controller area network (CAN) 224. In one example, the sensor system 222 may include the sensors 16 of FIG. 1. The sensor system 222 may include torque sensors, temperature sensors, speed sensors, and the like. In one example, the sensor system 222 may include at least a voltage sensor configured to measure a voltage of the power supply 208. Additionally, the sensor system 222 may further include a sensor configured to measure a frequency of phase current. In one example, the frequency of the phase current may be used to determine a speed of rotation of an electric motor. The CAN 224 may input a torque request to the controller 220 and controller 220 may output an actual torque value to the CAN 224. A diagnostic operating module 226 may provide inputs regarding desired operation of the transistor 212, the controller 220, and other components of the inverter 210. In one example, the diagnostic operating module 226 may provide an input to the controller 220 to adjust operating parameters of the transistor 212.

The controller 220 may include a primary operation unit 227 and a secondary operation unit 228. The primary operation unit 227 may execute one or more functional steps (e.g., providing torque requests, adjusting inverter power to the electric motor or to the HV battery, etc.). The secondary operation unit 228 may execute one or more diagnostic steps to maintain operating parameters within desired operating thresholds. A memory unit 229 may store instructions and/or determined values for comparing against input values provided to the controller 220.

Each of the HV battery supply 206, the LV battery supply 208, the HV battery 202, the primary operation unit 227, and the secondary operation unit 228 may communicate with corresponding actuators (e.g., gates) of the transistor 212. The actuators may adjust various operating parameters of the transistor 212 based on the signals provided by the controller 220 and the power supplies, which may adjust power provided from the transistor 212 to the electric motor 230. In one example, the electric motor 230 is a non-limiting example of prime mover 106 of FIG. 1. The actuators may be a transistor or a switch.

The inverter 210 may further include a secondary control loop, via hardware, for determining if operation of the system is outside of desired operating parameters. That is to say, a secondary monitoring system, that works in parallel or in series to the diagnostic operating module is included in the inverter 210 to further promote desired operation of the transistor 212 and increase a longevity thereof.

The secondary control loop may include a hardware unit 240. The hardware unit 240 may be a hardware active short circuit (HASC). The HASC 240 may receive inputs regarding a bus voltage hysteresis and a current frequency of a power phase output of the inverter. The HASC 240 may communicate with a watchdog 244 of a companion chip 242, communicatively coupled to the controller 220. The watchdog 244 of the companion chip 242 may monitor a function of the controller 220, including whether the controller 220 is degraded, receiving power, or the like. The bus voltage hysteresis and the current frequency of the power phase output of the inverter may be compared to determined values to determine if an adjusted mode of operation is desired to mitigate degradation to the transistor 212. A logic circuit of the HASC 240 is illustrated in FIG. 3.

In one example, the example of FIG. 2 may be used with a 3 phase motor and/or a 6 phase motor. A number of monitoring circuits (e.g., the HASC) may be independent of the phases of the motor. As such, the number of monitoring circuits may be different than or equal to the number of phases of the motor.

In one example, additionally or alternatively, the voltage sensor may be omitted and a backup encoder power by a backup power supply may be used. In some examples, additionally or alternatively, the controller 220 may be powered via the HV power supply, with a LV flyback arranged therebetween. The LV power supply of the vehicle may be function as a backup power supply if the HV power supply is interrupted. In some examples, additionally or alternatively, a duplicate of the controller 220 may be included in the inverter 210 and function as a back-up controller. The duplicate may include an active short circuit (ASC) software programmed in memory thereof such that when the controller 220 is degraded or unpowered and unable to execute instructions in memory thereof related to its ASC for reaching a steady state of the inverter 210, the back-up controller may be powered via back-up control supply. The back-up controller may be arranged instead of or in combination with the HASC 240.

Turning now to FIG. 3, it shows an example 300 of the HASC 240. The HASC 240 may include a logic circuit 310 configured to receive a plurality of inputs via a receiver 320. A transmitter 330 may transmit one or more commands to a device external to the HASC 240.

The receiver 320 may receive a first input 322 related to an operation of a controller (e.g., controller 220 of FIG. 2).

The first input 322 may indicate if the controller is responding. In one example, the first input 322 may be sent from watchdog 244 of FIG. 2. The watchdog 244 may monitor a status of the controller 220. In one example, the controller 220 may periodically send a signal to the watchdog 244 indicating it is operating. Additionally or alternatively, the watchdog 244 may be configured to track operation of the controller 220 and detect when the controller 220 is not operating as desired or shutoff.

The receiver 320 may receive a second input 324 related to a temperature of one or more of the vehicle, the electric motor, the controller, or another device of the traction system 200 of FIG. 2. The temperature input may be used to activate the HASC based on a degradation of one or more device. For example, if the temperature input is greater than a determined temperature, then operation of a device may no longer be desired and the HASC may be activated. The determined temperature may be based on a temperature at which a device may no longer operate as desired and a degradation in performance is detected. In one example, an electronic stop 340 may signal to a transmitter 342 to operate in a third operating state (e.g., third operating state 530 of FIG. 5) in response to a motor speed being greater than a threshold speed and the temperature being above the determined temperature. In one example, the third operating state includes where the multiple conditions block a steady state operation and the electronic stop is activated since the HASC 240 may not be activated due to current conditions. The third operating state is described in greater detail below.

The receiver 320 may receive a third input 326 related to a measurement of a high voltage direct current (DC) bus, herein referred to as Vbus. The HASC 240 may monitor the Vbus to determine if Vbus hysteresis is greater than a threshold value. In one example, the Vbus, along with a phase current frequency may be used to determine which steady state operation to employ, wherein the steady state operation is activated via either the ASC or the HASC 240. As described above, the ASC is a software circuit of the controller and separate from the HASC 240.

The logic circuit 310 may send a first output 332 to the controller. The first output 332 may indicate a diagnostic of the controller operating condition based on the first input 322.

In one example, if the HASC 240 is activated to enter a first operating state or a second operating state, then the HASC 240 may send a second output 334. The second output 334 may disable high-voltage through the traction system. The HASC 240 may then limit a torque delivery of the electric motor to a threshold torque value by applying a phase limit via a third output 338. The third output 338 may be based on an input 336, the input 336 related to a pulse-width modulation of the low-voltage. In one example, the phase limit includes reducing the phasing from a 6-phase to a 3-phase.

In one example, the active short-circuit may be activated by the controller during if demanded when the controller is not degraded. The HASC 240 is a stand-alone circuit and is activated when the CPU is not responding, which may monitored via a monitoring/watchdog circuit. Motor speed is included in the logic to activate the HASC 240 or deactivate the active short-circuit. The active short-circuit is deactivated at low speed because there is a zone where torque is generated if the phases are shorted. Operation of the different operating states are described in greater detail below.

Turning now to FIG. 4, it shows a plot 400 illustrating a bus voltage 410. The bus voltage 410 is compared to a first threshold 412 and a second threshold 414. The bus voltage 410 may oscillate between the first threshold 412 and the second threshold 414 based on a switching between the HASC being active and a freewheel strategy being active. The HASC may be active as the bus voltage 410 decrease toward the second threshold 414. At the second threshold, the bus voltage may be relatively low and demand recharging via the freewheel strategy, which includes opening all six gates of the transistor (e.g., transistor 212 of FIG. 2). The voltage may be maintained below the first threshold 412 to mitigate degradation to the back-up power supply (e.g., back-up power supply 206 of FIG. 2).

Turning now to FIG. 5A, it shows a plot 500 illustrating operating modes based on motor speed and motor temperature. The motor temperature (Tm) is plotted on the abscissa and motor speed is plotted on the ordinate. Dashed line 502 illustrates a motor speed threshold above or below which an operating state may be switched. Dashed line 504 illustrates a motor temperature threshold, above or below which the operating state may be switched. In some examples, additionally or alternatively, a de bus voltage and/or a phase current frequency, measured via a phase current frequency sensor, may be used to estimate the motor speed and/or motor temperature.

For example, if the motor speed is less than the motor speed threshold, then the motor temperature may be ignored with regard to selecting one of the operating states of FIG. 5, and a first operating state 510 may be selected. The first operating state 510 may include a free-wheel operation. The first operating state 510 may be executed via instructions stored in memory of the controller and may stop commutation of the power module and allow regenerative current to flow back to the high voltage battery (e.g., HV battery 202 of FIG. 2). For motor speeds below the motor speed threshold, a line-to-line voltage generated by a motor back electromagnetic field (EMF) may be lower than the battery voltage, which may avoid unintended braking torque being signaled.

If the motor speed is greater than the motor speed threshold and the motor temperature is less than the motor temperature threshold, then the second operating state 520 may be selected. The second operating state 520 may include an active short circuit (ASC) being executed by instructions stored in memory of the controller. Three power phase outputs may be shorted within the inverter (e.g., inverter 210 of FIG. 2), which blocks regenerative current being sent to the HV battery. When the motor speed is greater than the motor speed threshold, the line-to-line voltage generated by the motor back EMF is higher than the battery voltage. The ASC of the second operating state 520 may allow continuous current flows through the power output phases of the inverter, which may only be desired when the motor temperature is less than the motor temperature threshold while the motor speed is greater than the motor speed threshold. If the controller is inactive, the HASC may be used to executed the second operating state.

If the motor speed is greater than the motor speed threshold and the motor temperature is greater than the motor temperature threshold, then the third operating state 530 may be selected. The third operating state 530 may include the free-wheel operation in combination with a stop physical interface being activated. In one example, the third operating state is a shut-down state and is descried at high motor speeds and temperatures above the motor speed threshold and the motor temperature threshold.

Turning now to FIG. 5B, it shows an embodiment 550 of a transistor 560. The transistor 560 may be used similarly to the transistor 212 of FIG. 2. The transistor 560 shows the three-phases being shorted by closing T2, T4, and T6 and opening T1, T3, and T5. During the second and third states, the switches of the three-phase inverter 550 may be operated identically. In one example, T2, T4, and T6 are on, each of the three-phases are shorted, and the HASC is active. The third operating state may be differentiated from the second operating state in that the third operating state includes a stop request. By doing this, regenerative current may be blocked. When the phases are being shorted to bus, no voltage is present and thus no current is directed back to the battery. The phase currents are alternating current (AC) and circulating between the motor and the power module but not to the battery. When a freewheel strategy is being executed, each of T1, T2, T3, T4, T5, and T6 may be opened. Gates of the transistor 560 corresponding to the HV battery or the LV battery may be referred to as a battery contactor and may be actuated from an open position to a closed position or vice-versa.

Turning now to FIG. 6, it shows a method 600 for detecting degradation to a low-voltage power supply to a controller. The method 600 may further include selecting an operating state based on one or more of a de bus voltage, a motor speed, a motor temperature, and a phase frequency. Instructions for carrying out method 600 may be executed by a controller based on instructions stored on a memory of the controller and in conjunction with signals received from sensors of the vehicle system, such as the sensors described above with reference to FIGS. 1 and 2. The controller may employ actuators of the vehicle system to adjust operation, according to the method described below.

The method 600 begins at 602, which includes determining operating parameters. Operating parameters may include, but are not limited to, one or more of a power supply status, a controller status, request for opening, motor speed, one or more IGBT gates opening, one or more IGBT gates closing, bus voltage hysteresis, phase current frequency, and a battery contactor position. The bus voltage hysteresis may be measured via a first voltmeter coupled to the bus. The phase current frequency may be measured using a frequency-to-voltage converter.

At 604, the method 600 may include determining if a degradation is present. The degradation may include determining if a power supply to the controller is absent and/or if the controller is degraded. If a degradation is not present, then at 606, the method 600 may include maintaining current operating parameters.

At 608, the method 600 may include powering the controller with the low-voltage power supply. As such, the low voltage battery may supply charge to the controller.

Returning to 604, if a degradation is present, such as the low voltage power supply being absent, then at 610, the method 600 may include determining a motor speed. The motor speed may be estimated based on the phase current frequency. For example, as the phase current frequency increases, the motor speed may increase.

At 612, the method 600 may include determining the DC bus voltage. The DC bus voltage may provide an indication if the high voltage power supply is available to operate the controller.

At 614, the method 600 may include determining a motor temperature. The motor temperature may be sensed via a temperature sensor and/or may be estimated based on one or more parameters including the motor speed, an ambient temperature, and a vehicle speed.

At 616, the method 600 may include determining if the motor speed is less than a motor speed threshold and/or if the Vbus is less than a threshold voltage. The motor speed threshold may be based on a relatively low motor speed. In one example, the threshold voltage may be identical to the second threshold 414 of FIG. 4. If the motor speed threshold is less than the motor speed threshold, then at 618, the method 600 may include selecting the first operating state. The first operating state may include the freewheel discharge operation described above. In one example real-world operation, the first operating state may be activated in response to an unrequested brake request at motor speeds less than the motor speed threshold.

If the motor speed is not less than the motor speed threshold, then at 620, the method 600 may include determining if the motor temperature is less than a motor temperature threshold. If the motor temperature is less than the motor temperature threshold, then at 622 the method 600 may include selecting the second state. As described above, the second state may include activating the ASC.

If the motor temperature is not less than the motor temperature threshold, then at 624, the method 600 determined that the motor speed is greater than the motor speed threshold and the motor temperature is greater than the motor temperature threshold.

At 626, the method 600 may include selecting a modified version of the first state with a stop request. In one example, the HASC is activated.

In one example, the disclosure provides support for a method for entering a steady state of an inverter to prevent regenerative voltage from flowing to a battery from an electric motor. A hardware active short circuit (HASC) may be activated in response to an active short circuit (ASC) being unavailable due to a power supply being unavailable and/or due to a controller being inactive (e.g., degraded). The HASC or the ASC may be activated in response to a maintenance request from a service provider to access the inverter and/or other component of the traction system. Additionally or alternatively, the HASC or the ASC may be activated when the electric motor speed is greater than a threshold speed, which may occur when driving down a slope. Additionally or alternatively, the HASC or the ASC may be activated when a battery contactor is opened and the electric motor speed is greater than the threshold speed.

The method may include two steady states reached via three different operating states. A first operating state may produce a first steady state via an insulated-gate bipolar transistor (IGBT) opening (e.g., the six switches of FIG. 5B are open) when the motor speed is less than a lower threshold speed. The lower threshold speed is less than the threshold speed. This may be activated by the ASC or the HASC if the ASC is unavailable. Thus, the battery contactor may be open during the first operating state. A second operating state may produce the second steady state via closing the IGBT switches on the three-phases. This may be activated by the HASC when the motor speed is greater than the threshold speed. The third operating state may produce the second steady state via an electronic stop when the HASC is unavailable. The HASC may be unavailable when power is not supplied thereto or when the HASC is degraded. Thus, the battery contactor may be closed during the second and third operating states. Vbus hysteresis and a phase current frequency may be used to determine which steady state is desired. In one example, the phase current frequency may provide an indication to the electric motor speed. In this way, the ASC may activate the steady state when the controller is operating without faults. The HASC may activate the steady state when the controller is operating with faults or no power is available. The electronic stop may activate the steady state when the HASC cannot be activated.

TABLE 1

| steady state strategy | | | |
|---|---|---|---|
| Contactor position | Motor Speed | Controller functional | Controller degraded |
| Closed | High | ASC | HASC |
| Closed | Low | FW | FW |
| Open | High | ASC-FW | HASC-FW |
| Open | Low | FW | FW |

Table 1 above illustrates a strategy for reaching a steady state of the inverter including whether the ASC or the HASC activates the steady state. High and low motor speeds may be compared to a single threshold, such as motor speed threshold illustrated via dashed line 502 of FIG. 5A. As shown in Table 1, when the controller is functional, the motor speed is high, and the contactor is closed, the ASC provides the steady state. When the controller is degraded, the motor speed is high, and the contactor is closed, the HASC provides the steady state. When the controller is functional or degraded, the motor speed is low, and the contactor is closed, the freewheel (FW) provides the steady state. When the controller is functional, the motor speed is high, and the contactor is in an open position, the ASC and the FW provide the steady state. When the controller is degraded, the motor speed is high, and the contactor is in an open position, the HASC and the FW provide the steady state.

Turning now to FIG. 7, it graphically illustrates an operating sequence 700 showing conditions of components of a traction system. Plot 710 illustrates a motor speed, dashed line 712 illustrates an upper threshold motor speed, and dashed line 714 illustrates a lower threshold motor speed. Plot 720 illustrates a Vbus, dashed line 722 illustrates an upper threshold HASC voltage, and dashed line 724 illustrates a lower threshold FW voltage. Plot 730 illustrates a controller activity. Plot 740 illustrates a battery contactor position. Plot 750 illustrates if the ASC is on or off. Plot 760 illustrates if the HASC is on or off. Plot 770 illustrates if the FW is on or off.

Prior to t1, the motor speed is above the upper threshold motor speed. As such, a steady state operation of the inverter may be requested. The Vbus is above the upper threshold HASC voltage. The controller is active and the battery contactor is in a closed position. As such, the only the ASC is activated to initiate the steady state of the inverter. In one example, the steady state may limit braking provided by the electric motor and/or regenerative current.

At t1, the motor speed decreases below the upper threshold motor speed and remains above the lower threshold motor speed. Between t1 and t2, steady state operation of the inverter may not be requested and the inverter may allow braking via the electric motor and/or regenerative current.

At t2, the motor speed increases above the upper threshold motor speed. Thus, a steady state operation of the inverter is requested. Between t2 and t3, the battery contactor is in an open position and the controller is active. As such, the ASC and the FW are used to achieve the steady state. In one example, the ASC is operated for a threshold period prior to using the FW strategy (e.g., opening the gates of a circuit of the inverter, such as the circuit of FIG. 5B) to maintain the steady state operation.

At t3, the motor speed decreases below the upper threshold motor speed and remains above the lower threshold motor speed. Between t3 and t4, steady state operation of the inverter may not be requested and the inverter may allow braking via the electric motor and/or regenerative current.

At t4, the motor speed increases above the upper threshold motor speed. Thus, a steady state operation of the inverter is requested while the battery contactor is open. The controller is not active. As such, the ASC may not be initiated based on feedback from a monitoring device, such as the watchdog 244 of the companion chip 242 of FIG. 2, indicating to the HASC the controller is unpowered and/or degraded. Between t4 and t5, the HASC is activated. Additionally, since the contactor is open, the FW may be initiated alternatingly with the HASC. For example, the HASC may be operated for a threshold period based on the Vbus. Once the Vbus reaches the lower threshold FW voltage, the HASC may be deactivated and the FW may be activated. The HASC may be reactivated once the Vbus reaches the upper threshold HASC voltage. The FW and the HASC may continue to alternate based on the Vbus voltage during the steady state operation. In one example, the HASC is powered via a capacitor, wherein a charge thereof corresponds to the Vbus. When the charge of the capacitor decreases, the HASC is deactivated and the FW is activated to recharge the capacitor.

At t5, the motor speed decreases below the upper threshold motor speed. The battery contactor is moved to a closed position. Between t5 and t6, the motor speed remains above the lower threshold motor speed. As such, steady state operation of the inverter is not requested.

At t6, the motor speed increases above the upper threshold motor speed. As such, a steady state operation of the inverter is requested. Between t6 and t7, the controller is not active. As such, the HASC is activated and the Vbus decreases. With the battery contactor closed, degradation to the capacitor may not occur and protection of the capacitor via the FW may not be desired. As such, only the HASC is activated between t6 and t7.

At t7, the motor speed decreases below the lower threshold motor speed. After t7, the motor speed remains between the upper and lower threshold motor speeds. As such, steady state operation of the inverter is not requested.

The disclosure provides support for a method for an inverter of a traction system comprising an electric motor, the method including selecting between strategies for activating a steady state of the inverter based on an electric motor speed and a de bus voltage. A first example of the method further includes selecting a hardware active short circuit (HASC) to activate the steady state in response to the electric motor speed being greater than a threshold and the DC bus voltage being less than a threshold voltage, wherein the threshold voltage is based on a motor electromagnetic field (EMF) voltage. A second example of the method, optionally including the first example, further includes selecting a hardware active short circuit (HASC) to activate the steady state in response to in response to a battery contactor being closed, the electric motor speed being greater than a threshold speed, and one or more of a controller being degraded or a power supply being interrupted. A third example of the method, optionally including one or more of the previous examples, further includes selecting a hardware active short circuit (HASC) and a freewheel to activate the steady state in response to a battery contactor being open, the electric motor speed being greater than a threshold speed, and a controller being degraded, wherein the HASC is activated for a threshold period prior to initiating a freewheel function via opening all switches of the inverter. A fourth example of the method, optionally including one or more of the previous examples, further includes where a capacitor supplies backup power to the HASC during the threshold period. A fifth example of the method, optionally including one or more of the previous examples, further includes recharging the capacitor via the freewheel operation following the threshold period. A sixth example of the method, optionally including one or more of the previous examples, further includes selecting an active short circuit (ASC) and a freewheel to activate the steady state in response to a battery contactor being open, the electric motor speed being greater than a threshold speed, and a controller being powered, wherein the ASC is activated for a threshold period prior to initiating a freewheel function via opening all switches of the inverter.

The disclosure provides additional support for a system for a vehicle including an inverter coupled to an electric motor and a battery, a controller with computer-readable instructions stored on non-transitory memory thereof that when executed enable the controller to activate an active short circuit (ASC) and enter a steady state of the inverter in response to one or more of a vehicle speed, an electric motor speed, and a de bus voltage, a monitoring device configured to monitor an activity of the controller, and a hardware active short circuit (HASC) configured to activate and enter the steady state of the inverter in response to the controller being inactive and one or more of the vehicle speed, the electric motor speed, and the de bus voltage. A first example of the system further includes where the controller is inactive when the controller is degraded or when a power supply is disrupted. A second example of the system, optionally including the first example, further includes where the electric motor speed is determined based on a phase current frequency, the phase current frequency sensed via a sensor. A third example of the system, optionally including one or more of the previous examples, further includes where a voltage sensor senses the de bus voltage. A fourth example of the system, optionally including one or more of the previous examples, further includes where the instructions further enable the controller to enter the steady state via a combination of the ASC and a freewheel strategy when a battery contactor is open, the electric motor speed is greater than a threshold speed, and the controller is active, wherein the freewheel strategy comprises where gates of a circuit are open. A fifth example of the system, optionally including one or more of the previous examples, further includes where the HASC is configured to transition the inverter to the steady state when the controller is inactive, the electric motor speed is greater than a threshold speed, and a battery contactor is open, wherein the HASC operates in combination with a freewheel strategy, wherein the freewheel strategy comprises where gates of a circuit are open. A sixth example of the system, optionally including one or more of the previous examples, further includes where the HASC and the freewheel strategy operate alternatingly for determined periods of time, wherein a determined period of time is based on the dc bus voltage. A seventh example of the system, optionally including one or more of the previous examples, further includes where the steady state comprises reducing a torque delivery of the electric motor.

The disclosure provides further support for a method for a traction system of a vehicle comprising an inverter, an electric motor, and a battery, the method including determining an activity of a controller, determining an electric motor speed, determining a de bus voltage, entering a steady state based on one or more of the electric motor speed and the de bus voltage, and selecting an active short circuit (ASC) or a hardware active short circuit (HASC) based on the activity of the controller. A first example of the method further includes where a power supply of the controller is different than a power supply of the HASC. A second example of the method, optionally including the first example, further includes where entering the steady state comprises using only the ASC, only the HASC, the ASC in combination with a freewheel strategy, the HASC in combination with the freewheel strategy, or only the freewheel strategy. A third example of the method, optionally including one or more of the previous examples, further includes where cycling the HASC on and off based on the de bus voltage during the steady state, wherein a freewheel strategy is activated when the HASC is off. A fourth example of the method, optionally including one or more of the previous examples, further includes where the steady state is further based on a battery contactor position.

As used herein, the term "approximately" is construed to mean plus or minus five percent of the range unless otherwise specified.

The following claims particularly point out certain combinations and sub-combinations regarded as novel and nonobvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for an inverter of a traction system comprising an electric motor, the method comprising:
   selecting between strategies for activating a steady state of the inverter based on an electric motor speed and a direct current (DC) bus voltage; and
   selecting an active short circuit (ASC) and a freewheel to activate the steady state in response to a battery contactor being open.

2. The method of claim 1, further comprising selecting a hardware active short circuit (HASC) to activate the steady state in response to the electric motor speed being greater than a threshold speed and the DC bus voltage being less than a threshold voltage, wherein the threshold voltage is based on a motor electromagnetic field (EMF) voltage.

3. The method of claim 1, further comprising selecting a hardware active short circuit (HASC) to activate the steady state in response to in response to a battery contactor being closed, the electric motor speed being greater than a threshold speed, and one or more of a controller being degraded or a power supply being interrupted.

4. The method of claim 1, further comprising selecting a hardware active short circuit (HASC) and the freewheel to activate the steady state in response to a battery contactor being open, the electric motor speed being greater than a threshold speed, and a controller being degraded, wherein the HASC is activated for a threshold period prior to initiating a freewheel function via opening all switches of the inverter.

5. The method of claim 4, wherein a capacitor supplies backup power to the HASC during the threshold period.

6. The method of claim 5, further comprising recharging the capacitor via the freewheel operation following the threshold period, wherein the DC bus voltage oscillates between a first threshold voltage and a second threshold voltage based on a switching between the HASC being active and the freewheel being active.

7. The method of claim 1, wherein selecting the active short circuit (ASC) and the freewheel to activate the steady state is further in response to the electric motor speed being greater than a threshold speed and a controller being powered, and wherein the ASC is activated for a threshold period prior to initiating a freewheel function via opening all switches of the inverter.

8. A system for a vehicle, comprising:
   an inverter coupled to an electric motor and a battery;
   a controller with computer-readable instructions stored on non-transitory memory thereof that when executed enable the controller to activate an active short circuit (ASC) and enter a steady state of the inverter in response to one or more of a vehicle speed, an electric motor speed, and a direct current (DC) bus voltage, wherein the instructions further enable the controller to enter the steady state via a combination of the ASC and a freewheel strategy when a battery contactor is open;
   a monitoring device configured to monitor an activity of the controller; and
   a hardware active short circuit (HASC) configured to activate and enter the steady state of the inverter in response to the controller being inactive and one or more of the vehicle speed, the electric motor speed, and the DC bus voltage.

9. The system of claim 8, wherein the controller is inactive when the controller is degraded or when a power supply is disrupted.

10. The system of claim 8, wherein the electric motor speed is determined based on a phase current frequency, the phase current frequency sensed via a sensor.

11. The system of claim 8, wherein a voltage sensor senses the DC bus voltage.

12. The system of claim 8, wherein the instructions further enable the controller to enter the steady state via a combination of the ASC and a freewheel strategy when the electric motor speed is greater than a threshold speed and the controller is active, and wherein the freewheel strategy comprises where gates of a circuit are open.

13. The system of claim 8, wherein the HASC is configured to transition the inverter to the steady state when the controller is inactive, the electric motor speed is greater than a threshold speed, and a battery contactor is open, wherein the HASC operates in combination with a freewheel strategy, and wherein the freewheel strategy comprises where gates of a circuit are open.

14. The system of claim 13, wherein the HASC and the freewheel strategy operate alternatingly for determined periods of time, and wherein a determined period of time is based on the DC bus voltage.

15. The system of claim 8, wherein the steady state comprises reducing a torque delivery of the electric motor.

16. A method for a traction system of a vehicle comprising an inverter, an electric motor, and a battery, the method comprising:
   determining an activity of a controller;
   determining an electric motor speed;
   determining a direct current (DC) bus voltage;

entering a steady state based on one or more of the electric motor speed and the DC bus voltage; and selecting an active short circuit (ASC) or a hardware active short circuit (HASC) based on the activity of the controller, wherein a power supply of the controller is different than a power supply of the HASC.

17. The method of claim 16, wherein a freewheel discharge operation is activated in response to an unrequested brake request at a motor speed less than a threshold motor speed.

18. The method of claim 16, wherein entering the steady state comprises using only the ASC, only the HASC, the ASC in combination with a freewheel strategy, the HASC in combination with the freewheel strategy, or only the freewheel strategy.

19. The method of claim 16, further comprising cycling the HASC on and off based on the DC bus voltage during the steady state, wherein a freewheel strategy is activated when the HASC is off.

20. The method of claim 16, wherein the steady state is further based on a battery contactor position.

* * * * *